United States Patent [19]
Pierrat et al.

[11] Patent Number: 5,885,734
[45] Date of Patent: Mar. 23, 1999

[54] PROCESS FOR MODIFYING A HIERARCHICAL MASK LAYOUT

[75] Inventors: Christophe Pierrat; Chin Aik Le, both of Boise, Id.

[73] Assignee: Micron Technology, Inc., Boise, Id.

[21] Appl. No.: 689,932

[22] Filed: Aug. 15, 1996

[51] Int. Cl.$^6$ ............................. G03F 9/00; H01J 37/302
[52] U.S. Cl. ............................. 430/5; 364/488; 364/489; 364/490; 364/491
[58] Field of Search ................................. 430/5; 364/488, 364/489, 490, 491

[56] References Cited

U.S. PATENT DOCUMENTS

| | | | |
|---|---|---|---|
| 5,079,717 | 1/1992 | Miwa | 364/490 |
| 5,249,133 | 9/1993 | Batra | 364/489 |
| 5,308,722 | 5/1994 | Nistler | 430/5 |
| 5,517,607 | 5/1996 | Nishimura et al. | 395/160 |
| 5,663,893 | 9/1997 | Wampler et al. | 364/491 |

FOREIGN PATENT DOCUMENTS

| | | | |
|---|---|---|---|
| 2-140743 | 5/1990 | Japan | G03F 1/08 |

*Primary Examiner*—Mark Chapman
*Attorney, Agent, or Firm*—Arnold, White & Durkee

[57] ABSTRACT

A binary mask layout design arranged hierarchically to include a plurality of levels is modified to include optical proximity effect corrections or phase shifting layers. This is accomplished by beginning at the lowest level of the hierarchy and modifying elements or cells in the design. Any modifications that are uniform to corresponding cells throughout the level are placed in the same level in the hierarchy. Any modifications that apply only to selected cells in the level are placed in a higher level in the hierarchy. The process is repeated for all levels in the hierarchy.

20 Claims, 3 Drawing Sheets

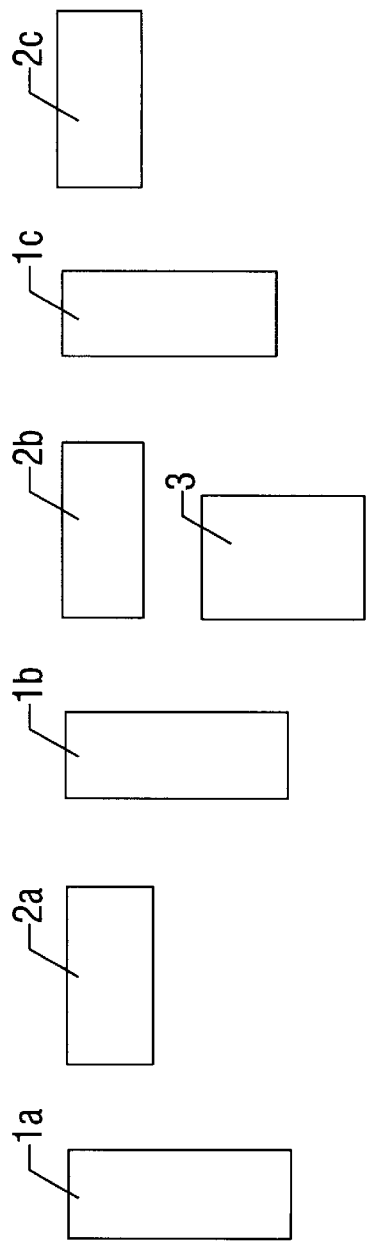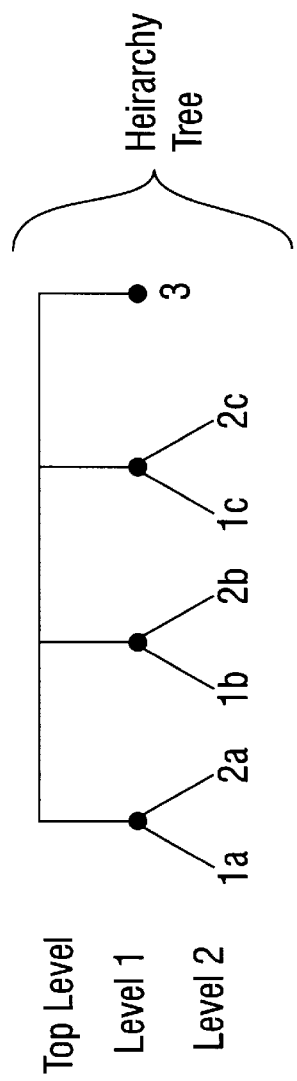
FIG. 1A
FIG. 1B

PROCESS FOR MODIFYING A HIERARCHICAL MASK LAYOUT

This invention was made with government support under Contract No. MDA 97292-C-0054 awarded by Advanced Research Projects Agency (ARPA). The government has certain rights in this invention.

BACKGROUND OF THE INVENTION

The present invention relates to processes for designing mask layouts used in the fabrication of semiconductor devices. More particularly, the present invention relates to processes for designing mask layouts that are arranged in a hierarchical format.

Advances in photolithographic techniques have resulted in decreases in the size of the features on a chip. The lateral dimensions of features are generally defined by photolithographic techniques in which a detailed pattern is transferred to a photoresist by shining light through a mask or reticle. As feature size has decreased, the number of features on a chip has increased. This has resulted in mask designs that are much larger and more complicated than earlier designs.

In recent years, phase shifting masks have been developed to improve photolithographic processes. Phase shifting masks increase image contrast and resolution without reducing wave length or increasing numerical aperture. These masks also improve depth of focus and process latitude for a given feature size.

With phase shift photolithography, the interference of light rays is used to overcome the problems of diffraction and improve the resolution and depth of optical images projected onto a target. With this technology, the phase of the exposure light at the target is controlled such that adjacent bright areas are preferably formed 180 degrees out of phase with each other. Dark regions are thus produced between the bright areas by destructive interference even when diffraction would otherwise cause these areas to be lit. This technique improves total resolution at the target.

In general, a phase shifting mask is constructed with a repetitive pattern formed of three distinct layers of material. An opaque layer provides areas that allow no light transmission. A first transparent layer provides areas which allow close to 100% of the light to pass through. A transparent phase shifting layer provides areas which allow close to 100% of the light to pass through but phase shifted 180 degrees from the light passing through the first transparent layer. The first transparent layer and the phase shifting layer are positioned such that light rays diffracted through each area are cancelled out in a darkened area between them. This creates a pattern of dark and bright areas which can be used to clearly delineate features of a pattern defined by the opaque layer on the semiconductor wafer. Another method of constructing a phase shifting mask utilizes a semitransparent layer to cause the phase shift.

One process for fabricating phase shifting masks uses a voting technique to fabricate a defect-free printing mask. The process includes forming an opaque layer on a major surface of a transparent substrate, patterning the opaque layer to expose portions of the underlying transparent substrate, forming a phase shifting mask layer to expose the portions of the underlying transparent substrate, phase-etching partway into the exposed portions of the transparent substrate by an amount equivalent to a preselected phase shift angle, and voting the phase shifting mask layer to accomplish the phase-etching in a series of steps, each equal to the phase shift angle, until a full 180° phase shift is accomplished.

Other processes of fabricating phase shifting masks include those in which a transparent film is formed over a portion of a mask to create a phase shifting layer as well as the etching of phase shifting channels into the mask substrate.

Another method that has been developed to produce masks for use in the fabrication of semiconductors containing small features is optical proximity effect correction ("OPC"). In this method, changes are made to the binary mask layout so that it will print more clearly. Because of the limited resolution of current photolithographic tools (i.e., steppers), patterns defined on the photomask are transferred into the resist on the wafer with some distortions referred to as optical proximity effects. The main consequences in term of line width control are: corner rounding, difference between isolated and semi-isolated or dense patterns, lack of CD linearity where small features print even smaller than their expected size compared to large features and line end shortening where the length of a line having a small line width becomes smaller than its expected size. Moreover, optical proximity effects are convoluted with subsequent processing step distortions like resist processing, including dry etch and wet etch proximity effects.

In order to achieve a sufficient line width control at the wafer level, the mask designs are corrected for proximity effects, namely re-entrant and outside serifs are used to correct rounding and the edges of patterns are moved to correct line width errors.

Because of their complexity, mask designs are usually generated on a computer and stored in a large data file. As the number of features on a chip has increased, the size of these data files has increased. This has produced files that are so large that they have become cumbersome to work with. One process that has been used to reduce the size of the data file and improve its manageability is to divide the layout into a number of smaller units or cells which can be arranged in a hierarchical format. However, when it is necessary to make changes in the layout, the hierarchical structure must be expanded into planar form for the changes to be made and incorporated into the design. This has proven to be an unwieldy and time consuming process.

Accordingly, it would be significant advancement in the art to provide a process for correcting a hierarchical mask layout in which changes could be made efficiently at sublevels in the hierarchical structure without flattening the entire layout. Such a process is disclosed and claimed herein.

SUMMARY OF THE INVENTION

The present invention provides a process for correcting or modifying a hierarchical layout of a semiconductor mask at sublevels without having to flatten the entire layout. The present invention is particularly suitable for applying optical proximity effect corrections to binary mask layout designs and to applying phase shifting layers to binary mask layouts.

In a preferred embodiment of the present invention, a binary mask layout design that has been hierarchically arranged in a plurality of levels is modified to include optical proximity effect corrections. This is accomplished by beginning with the lowest level of the hierarchy. The elements in this level are analyzed to see if any modifications are necessary. If modifications are necessary, they are made to the design. Any modifications that are uniform to corresponding features throughout this level are placed in the same level in the hierarchy. Any modifications that apply only to selected features in this first level are placed in the next higher level in the hierarchy.

The process is repeated for each higher level of the hierarchy until all changes that are necessary for the design have been made. The present invention avoids the necessity of flattening the entire design before making changes.

BRIEF DESCRIPTION OF THE DRAWINGS

FIG. 1A is a schematic illustration of a portion of a binary mask layout.

FIG. 1B is a schematic illustration of the hierarchy tree corresponding to FIG. 1A.

DETAILED DESCRIPTION OF THE PREFERRED EMBODIMENTS

Figure 2A:
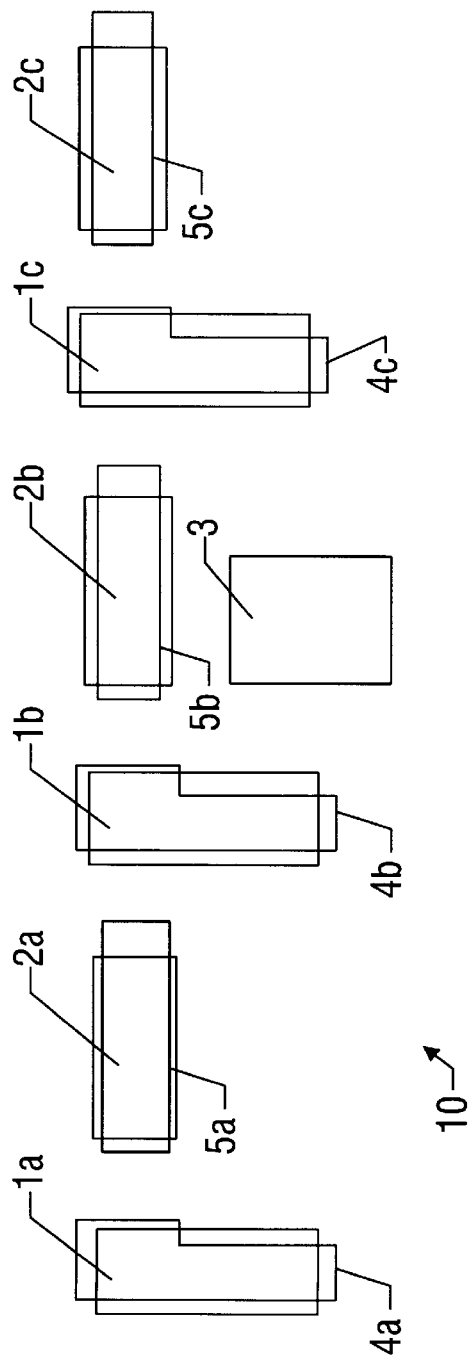
FIG. 2A is a schematic illustration of a portion of a mask layout illustrating initial changes that are made to the features in the binary mask layout of FIG. 1A.

The present invention provides a process for modifying or correcting a hierarchical mask layout which is quicker and easier to perform than conventional methods. The process involves modifying the layout at sublevels without planarizing the entire layout. The invention is best understood by reference to the attached drawings in which like parts are designated with like numerals.

Referring first to FIG. 1A, a portion of a binary mask layout is generally designated at 10 and includes a plurality of elements or cells 1a, 1b, 1c, 2a, 2b, 2c and 3. Elements 1a, 1b and 1c are all identical. Likewise, elements 2a, 2b and 2c are identical. Referring to FIG. 1B, elements 1a–c and 2a–c are all placed in level 2 of the hierarchy tree as individual cells. The combination of elements or cells 1a and 2a together form a cell which is placed in level 1 of the hierarchy tree. Likewise, cells 1b and 2b form a cell placed in level 1 and cells 1c and 2c form a cell placed in level 1. Element 3 is also placed in level 1 of the hierarchy tree.

Figure 2B:
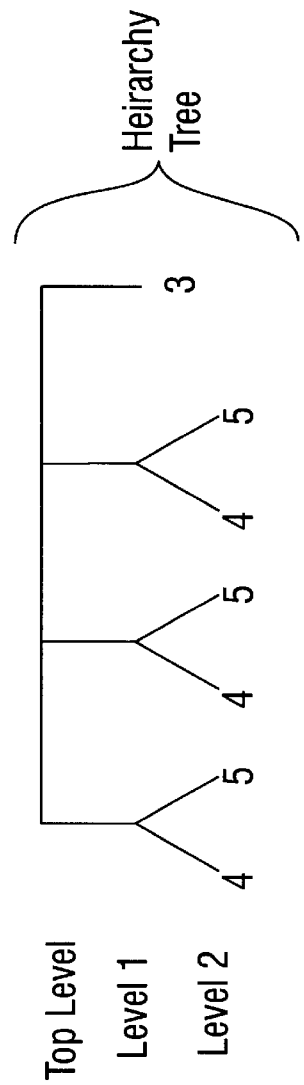
FIG. 2B is a schematic illustration of the hierarchy tree of the layout of FIG. 2A.

Reference is next made to FIGS. 2A and 2B which illustrate optical proximity effect corrections which are to be made to the binary mask layout illustrated in FIG. 1A. Polygons 4a, 4b and 4c correspond to elements 1a, 1b and 1c and include changes to be made to each of those elements. Since these changes are uniform throughout level 2, polygons 4a–c can be substituted for elements 1a–c in level 2 of the hierarchy tree. In a similar manner, polygons 5a, 5b and 5c correspond to changes to be made to elements 2a, 2b and 2c. Again since this change is to be made to all elements throughout the level, elements 5a–c can be substituted into level 2 of the hierarchy tree. These changes can be made in the design without flattening the entire layout.

Figure 3A:
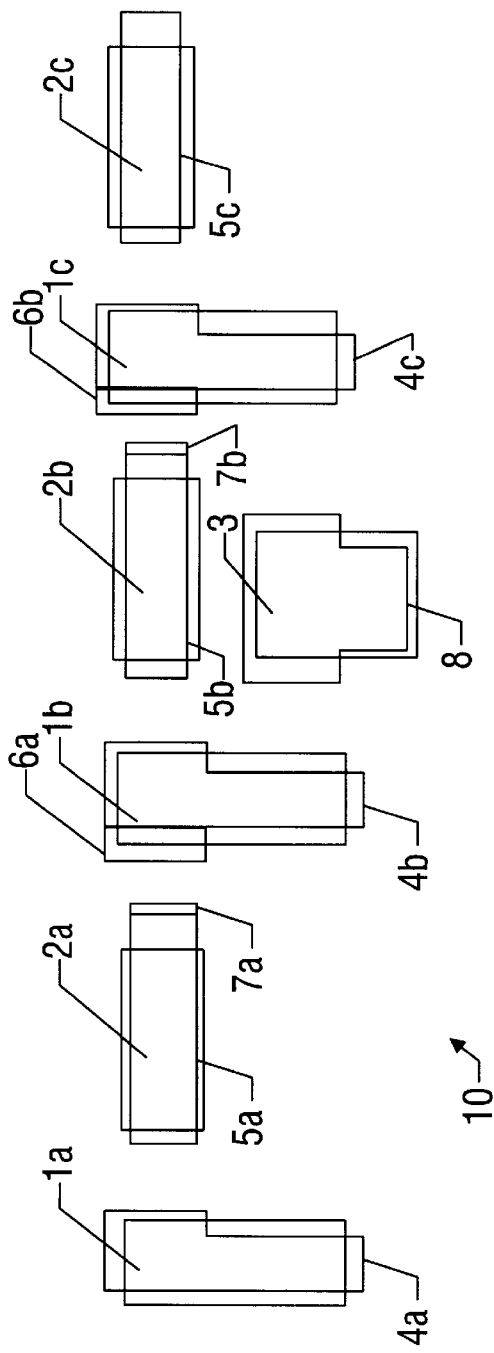
FIG. 3A is a schematic illustration of a portion of a mask layout illustrating additional changes made to the binary mask design of FIG. 1A.
Figure 3B:
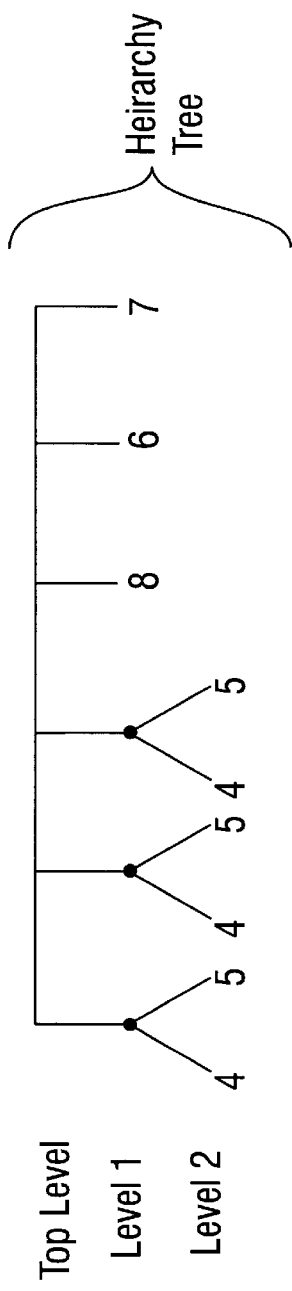
FIG. 3B is a schematic illustration of the hierarchy tree corresponding to FIG. 3A.

Referring next to FIGS. 3A and 3B, in order to complete the changes to element 1b because of its proximity to element 2a, it is necessary to add a polygon 6b to polygon 4b. Similarly, a polygon 6c must be added to polygon 4c to complete the changes to element 1c. However, since element 1a does not have a corresponding element to its left in the design, it does not require the addition of a polygon 6. Accordingly, polygons 6 are placed in level 1 of the hierarchy tree, the next higher level, since they are not applied to all of the corresponding elements in level 2.

With the addition of polygon 6 to polygon 4b, polygon 5a needs an additional correction. Accordingly, polygon 7a is subtracted from polygon 5a. Likewise, a polygon 7b is subtracted from polygon 5b. However, because polygon 5c does not have a feature to its right, it does not need to have a polygon 7 subtracted from it. Hence, polygons 7 are also placed in level 1 of the hierarchy tree since they do not apply to all corresponding elements in level 2.

This completes all of the changes that are necessary to the elements or cells in level 2.

Next, the elements or cells in level 1 are examined. In the illustrated embodiment, polygon 8 is substituted for element 3 in the design layout, because of the proximity of polygons 4b, 5b and 4c. Since this change applies to all corresponding elements in level 1 (in this instance only one occurrence), polygon 8 can be substituted for element 3 in level 1 of the hierarchy tree.

The procedure described above is repeated for each level in the hierarchy. Hierarchical mask layouts can have many levels. For example, it is not uncommon for hierarchical layouts for memory devices to have 10–15 levels. Changes that are uniform throughout a level are placed in the same level and non-uniform changes are placed in the next higher level. Non-uniform changes usually occur at the edges of arrays or in the periphery of a device.

With a binary mask layout design, it is generally possible to place all of the elements in a single layer in the mask design. However, when making advanced masks which include optical proximity effect corrections or phase shifting layers, it is oftentimes advantageous or necessary to create the mask in a number of layers in order to track changes that have been made and to facilitate additional changes or modifications.

With respect to the preferred embodiment described above, all of the elements in FIG. 1A could be placed in a single layer L0 even though they are in different levels in the hierarchy tree. However, when making the changes illustrated in FIGS. 2A and 3A, it is advantageous to put some of those changes in different layers. In the preferred embodiment, polygons 4a–c, 5a–c and 8 could be placed in a single layer L1. Additionally, since polygons 6 are simply additions to some of these polygons, they could also be included in layer L1.

Since polygons 7 are subtracted from polygons 5a and 5b, they are placed in a separate layer L2. At fracturing, layer L2 is subtracted from layer L1. The combination of layers L1 and L2 provides the final mask layout. Elements or cells from more than one level in the hierarchy tree can be combined in the same layer.

In a second preferred embodiment, polygons 4a–c and 5a–c are placed in layer L1. Polygons 6 are placed in a separate layer L2. In this embodiment, layers L1 and L2 would be added together at fracturing. Polygons 7 would then be placed in a layer L3 which would be subtracted from layer L1 at fracturing. Again, the combination of layers L1, L2 and L3 would provide the final mask layout.

While the invention has been described with respect to the presently preferred embodiments, it will be appreciated by those skilled in the art that modifications and changes can be made to the process of the present invention without departing from its spirit or essential characteristics. For example, the process can be applied to systems having different hierarchical arrangements. Additionally, the invention can be applied to changes or modifications to a mask layout that add phase shifting layers. Accordingly, all modifications or changes which come within the meaning and range of equivalency of the claims are to be embraced within their scope.

What is claimed is:

1. A process for modifying a hierarchical mask layout comprising:
   obtaining a binary mask layout design that has been arranged in a hierarchy having a plurality of levels;
   modifying elements of the design in a first level of said hierarchy to which changes are necessary;
   placing modifications that are uniform to corresponding elements throughout said first level in said first level in said hierarchy; and
   placing modifications that apply only to selected elements in said first level in a second level in said hierarchy, said second level being a higher level in said hierarchy than said first level.

2. A process for modifying a hierarchical mask layout as defined in claim 1 wherein said second level is the next higher level in said hierarchy.

3. A process for modifying a hierarchical mask layout as defined in claim 1 wherein said modifications comprise optical proximity effect corrections.

4. A process for modifying hierarchical mask layout as defined in claim 1 wherein said modifications comprise phase shifting layers.

5. A process for modifying a hierarchical mask layout as defined in claim 1 wherein modifications are made in a plurality of levels.

6. A process for modifying a hierarchical mask layout as defined in claim 1 wherein said hierarchy has at least ten levels and modifications are made to a plurality of levels.

7. A process for modifying a hierarchical mask layout as defined in claim 6 wherein modifications are first made to the lowest level in said hierarchy to which changes are necessary and are then made to successively higher levels.

8. A process for modifying a hierarchical mask layout comprising:
   obtaining a binary mask layout design having cells that are arranged in a hierarchy having a plurality of levels;
   creating modifications to cells in a first level of said hierarchy;
   placing modifications that are uniform to all similar cells in said first level in said first level in said hierarchy; and
   placing modifications that apply only to selected cells of a group of similar cells in said first level in a second level in said hierarchy.

9. A process for modifying a hierarchical mask layout as defined in claim 8 wherein said second level is higher in said hierarchy than said first level.

10. A process for modifying a hierarchical mask layout as defined in claim 9 wherein said second level is the next higher level.

11. A process for modifying a hierarchical mask layout as defined in claim 8 wherein said modifications comprise optical proximity effect corrections.

12. A process for modifying a hierarchical mask layout as defined in claim 8 wherein said modifications comprise phase shifting layers.

13. A process for modifying a hierarchical mask layout as defined in claim 8 wherein modifications are sequentially made in a plurality of levels.

14. A hierarchical mask layout comprising:
   a mask layout design that has been arranged in a hierarchy having a plurality of levels wherein elements in a first level of said hierarchy include changes made to a binary mask design upon which said mask layout is based, said changes in said first level being uniform to all corresponding elements throughout said first level and having modifications in a second level in said hierarchy, said modifications in said second level including modifications that apply only to selected elements in said first level.

15. A hierarchical mask layout as defined in claim 14 wherein said second level is a higher level in said hierarchy than said first level.

16. A hierarchical mask layout as defined in claim 14 wherein said modifications comprise optical proximity effect corrections.

17. A hierarchical mask layout as defined in claim 14 wherein said modifications comprise phase shifting layers.

18. A hierarchical mask layout as defined in claim 14 wherein said hierarchy has at least ten levels and modifications are made to a plurality of said levels.

19. A hierarchical mask layout comprising:
   a mask layout design that has been arranged in a hierarchy having a plurality of levels wherein cells in a first level of said hierarchy include changes made to a binary mask design upon which said mask layout is based, said changes in said first level being uniform to all corresponding cells throughout said first level and having modifications in a second level in said hierarchy, said modifications in said second level including modifications that apply only to selected cells in said first level.

20. A hierarchical mask layout as defined in claim 19 wherein said second level is the next higher level than said first level in the hierarchy.

* * * * *